(12) United States Patent
Sterzbach

(10) Patent No.: US 11,933,668 B2
(45) Date of Patent: Mar. 19, 2024

(54) SAMPLING ASSEMBLY AND TESTING INSTRUMENT

(71) Applicant: Rohde & Schwarz GmbH & Co. KG, Munich (DE)

(72) Inventor: Bernhard Sterzbach, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 28 days.

(21) Appl. No.: 16/780,550

(22) Filed: Feb. 3, 2020

(65) Prior Publication Data

US 2021/0239524 A1     Aug. 5, 2021

(51) Int. Cl.
| | |
|---|---|
| *G01J 1/44* | (2006.01) |
| *G01J 1/04* | (2006.01) |
| *H01J 37/147* | (2006.01) |
| *H01J 37/244* | (2006.01) |

(52) U.S. Cl.
CPC ............ *G01J 1/44* (2013.01); *G01J 1/0414* (2013.01); *H01J 37/1472* (2013.01); *H01J 37/244* (2013.01)

(58) Field of Classification Search
CPC ........ G01J 1/44; G01J 1/0414; H01J 37/1472; H01J 37/244; G01R 13/20; H03M 1/0678; H03M 1/1009; H03M 1/124
See application file for complete search history.

(56) References Cited

U.S. PATENT DOCUMENTS

| | | | |
|---|---|---|---|
| 3,714,424 A | * | 1/1973 | Weber ............... H01J 37/256 250/399 |
| 4,712,001 A | | 12/1987 | d'Humieres et al. |
| 5,083,849 A | | 1/1992 | Crosby |
| 11,131,704 B2 | * | 9/2021 | Barthel ............. G01R 31/2837 |

(Continued)

FOREIGN PATENT DOCUMENTS

EP          0187087 B1     7/1986

OTHER PUBLICATIONS

Yuzo Sasaki et al. Resolution Enhancement of KTa1-x Nbx O3 ElectroOptic Deflector by Optical Beam Shaping, 2013, Appl. Phys. Express 6 102201 (Year: 2013).*

(Continued)

*Primary Examiner* — David A Vanore
(74) *Attorney, Agent, or Firm* — CHRISTENSEN O'CONNOR JOHNSON KINDNESS PLLC

(57) ABSTRACT

A sampling assembly is described. The sampling assembly comprises an input, a light source unit, at least one deflector unit, and a light receiver. The input is configured to receive an electrical input signal. The light source unit is configured to generate and output a light beam in the direction of the deflector unit. The light source unit is configured to adapt an intensity of the light beam based on an amplitude of the input signal. The deflector unit is configured to obtain a deflection command signal. The deflector unit further is configured to deflect the light beam into at least one spatial direction based on the deflection command signal. The light (Continued)

receiver comprises at least two photosensitive pixels. The light receiver is configured to receive the light beam via at least one of the at least two photosensitive pixels, and the light receiver is configured to convert received light into an electrical output signal. Further, a testing instrument is described.

13 Claims, 2 Drawing Sheets

(56) References Cited

U.S. PATENT DOCUMENTS

| | | | | |
|---|---|---|---|---|
| 11,137,428 | B2* | 10/2021 | Haberstroh | G01R 19/2509 |
| 11,143,679 | B2* | 10/2021 | Schaefer | G01R 19/2509 |
| 11,153,187 | B2* | 10/2021 | Berger | H04L 43/0864 |
| 2008/0278683 | A1* | 11/2008 | Su | G01J 1/0414 |
| | | | | 351/205 |
| 2013/0270439 | A1* | 10/2013 | Adamec | H01J 37/244 |
| | | | | 250/310 |
| 2015/0348747 | A1* | 12/2015 | Ohashi | H01J 37/1475 |
| | | | | 250/310 |
| 2017/0207061 | A1* | 7/2017 | Li | H01J 37/28 |
| 2018/0029164 | A1* | 2/2018 | Kramer | G01J 1/0448 |
| 2018/0167561 | A1* | 6/2018 | Araya | G02B 21/008 |
| 2019/0074159 | A1* | 3/2019 | Takahashi | H01J 37/1477 |
| 2019/0239753 | A1* | 8/2019 | Wentz | A61B 5/1126 |
| 2019/0369035 | A1* | 12/2019 | Tsuchiya | G01N 23/2251 |
| 2020/0080949 | A1* | 3/2020 | Nishitani | H01J 37/244 |
| 2020/0150036 | A1* | 5/2020 | Prystupa | G01J 1/44 |
| 2020/0381207 | A1* | 12/2020 | Ren | H01J 37/09 |
| 2021/0239524 | A1* | 8/2021 | Sterzbach | H01J 37/1472 |
| 2021/0319977 | A1* | 10/2021 | Liu | H01J 37/1474 |

OTHER PUBLICATIONS

Shih, T-M., et al., "Chipscale, single-shot gated ultrafast optical recorder," Optics Express 20(1):414-425, Dec. 21, 2011.

Römer, G.R.B.E., et al., "Electro-optic and acousto-optic laser beam scanners," 8th International Conference on Photonic Technologies LANE 2014, Physics Procedia 56:29-39, Sep. 2014.

Chao, J-H., et al., "High speed non-mechanical two-dimensional KTN beam deflector enabled by space charge and temperature gradient deflection," Optics Express 25(13), Jun. 2017, 12 pages.

\* cited by examiner

SAMPLING ASSEMBLY AND TESTING INSTRUMENT

FIELD OF THE DISCLOSURE

Embodiments of the present disclosure generally relate to a sampling assembly. Embodiments of the present disclosure further relate to a testing instrument.

BACKGROUND

For many types of signal analyses, a measured analog input signal has to be converted into a digitized input signal, such that digital signal processing techniques can be applied.

Up to a certain frequency threshold of the analog input signal, the input signal can conveniently be digitized via analog to digital converters (ADCs), which are well-known from the state of the art.

However, the conventional ADCs may not be sufficient for high input signal frequencies, for example for signal frequencies in the THz range.

Accordingly, there is a need for a sampling assembly as well as a testing instrument that allow for sampling of input signals at higher frequencies.

SUMMARY

Embodiments of the present disclosure provide a sampling assembly. In an embodiment, the sampling assembly comprises an input, a light source, at least one deflector, and a light receiver. The input is configured to receive an electrical input signal. The light source is configured to generate and output a light beam in the direction of the deflector. The light source is configured to adapt an intensity of the light beam based on an amplitude of the input signal. The deflector is configured to obtain a deflection command signal. The deflector further is configured to deflect the light beam into at least one spatial direction based on the deflection command signal. The light receiver comprises at least two photosensitive pixels. The light receiver is configured to receive the light beam via at least one of the at least two photosensitive pixels. The light receiver is configured to convert received light into an electrical output signal.

The sampling assembly according to the disclosure is based on the idea to convert the amplitude of the electrical input signal into a change of intensity of the light beam, while the light beam itself is in motion. The light beam is in motion since the light beam is deflected by the deflector based on the respective deflection command signal.

Due to the motion of the light beam, the individual pixels are only exposed to the light beam for a limited amount of time, and each pixel that is crossed by the light beam generates an electrical output signal. Thus, the electrical output signals of the pixels each represent a snapshot of the light beam intensity and thus of the momentary amplitude of the electrical input signal processed by the light source.

Accordingly, the reaction speed of the individual pixels does not have to match or even exceed the frequency of the light. Instead, multiple pixels are used consecutively, such that the individual pixels have enough time to process the incoming light.

In some embodiments, the amplitude of the generated electrical output signal is proportional to the light beam intensity.

Thus, the generated electrical output signal comprises information about the momentary amplitude of the electrical input signal. Moreover, as the order in which the light beam hits the individual pixels is known, the generated electrical output signal also comprises information about a time relation between the individual "snap shots" of the amplitude of the electrical input signal.

These pieces of information are tantamount to having a sampled version of the electrical input signal. However, the sampling assembly according to the disclosure can operate at much higher frequencies than conventional analog to digital converters.

In other words, the sampling assembly described above constitutes an optical analog to digital converter, which is capable of operating at high frequencies, for example up to the THz range.

Moreover, the sampling assembly described above comprises at least two different converting modules or converters, as the electrical input signal is converted into an optical signal, namely the light beam, by the light source. Further, the optical signal, namely the light beam, is converted back into an electrical output signal by the light receiver.

It is noted that in the context of this disclosure, the term "light" is to be understood to comprise not only visible light, but also light in the infrared range and/or in the ultraviolet range.

According to an aspect of the present disclosure, the light source, the deflector, and/or the light receiver are arranged along a common optical axis. In other words, the light source and the light receiver face each other, for example their active sides, wherein the deflector is interposed between the light source and the light receiver.

In some embodiments, the deflector has an input side and an output side opposite to the input side. This way, the main propagation direction of the light beam is maintained when the light is deflected by the deflector. In other words, the deflector may be different to a reflector that reflects impinging light.

In addition, the sampling device is configured to sample in real-time.

According to an aspect of the present disclosure, the light source comprises a laser. Lasers are for example advantageous for the sampling assembly according to the disclosure, as they can generate essentially monochromatic light with high intensity. This way, wavelength-dependent refractive indices of the deflector have less impact on the accuracy of the sampling assembly.

According to another aspect of the present disclosure, the deflector is configured to deflect the light beam into two different spatial directions based on the deflection command signal. Accordingly, the light receiver may be a two-dimensional screen, with a two-dimensional array of pixels arranged on the screen.

In an embodiment of the present disclosure, the deflector is configured to deflect the light beam according to a predefined pattern based on the deflection command signal. Thus, the deflector deflects the light beam such that the light beam hits the individual pixels in a predetermined order, wherein the order is determined by the deflection command signal.

In some embodiments, the light beam is deflected such that it hits the pixels in a periodic pattern, i.e. in a repeating pattern.

The deflection command signal may be generated such that the pattern or rather the order of pixels hit by the light beam can easily be identified. For example, the light beam is deflected such that it hits the pixels in a spiral pattern, in a zig-zag-pattern, etc.

Alternatively or additionally, the light beam may be deflected such that it hits at least a predefined portion of the pixels within one repetition of the pattern. The light beam may hit at least 25% of the pixels, at least 50% of the pixels and/or at least 75% of the pixels. In some embodiments, the light beam may hit all of the pixels during one repetition of the pattern.

In a further embodiment of the present disclosure, the deflector comprises at least one of an electro-optical element and an acousto-optic element. Generally speaking, the deflection of the light beam is based on deflection within the deflector, which can be influenced by changing the refractive index of the material of the deflector. For example, the refractive index of the at least one deflector in one embodiment is adapted by applying an electric field to the electro-optical element and/or by applying acoustic waves to the acousto-optic element.

The functionality of the at least one deflector may be based on the Pockels effect and/or the Kerr effect.

Such electro-optical elements and acousto-optic elements can be controlled to change the deflection angle of the light beam rather quickly, such that high sampling rates may be obtained. In some embodiments, sampling rates in the order of $10^{12}$ Hz or even higher may be obtained.

According to an aspect of the present disclosure, the sampling assembly further comprises an acquisition circuit or unit being connected to the light receiver, the acquisition unit being configured to determine a set of acquisition samples based on the electrical output signal. The individual acquisition samples contain information about the amplitude of the original input signal, as the amplitude of the electrical output signal corresponding to that particular acquisition sample is proportional to the light beam intensity, which in turn is proportional to the amplitude of the electrical input signal.

Moreover, the set of acquisition samples also contains time information about the time relation between the individual acquisition samples, as the correct order of the individual acquisition samples is the same as the order in which the corresponding pixels are hit by the light beam.

Thus, the set of acquisition samples comprises information about the development of the amplitude of the electrical input signal over time. In other words, the set of acquisition samples corresponds to a sampled version of the original electrical input signal. As mentioned above, the original electrical input signal has been converted into an optical signal, which in turn has been re-converted into the electrical signal prior to being acquired by the acquisition unit.

The acquisition unit may be configured to determine the set of acquisition samples based on the deflection command signal. In some embodiments, the acquisition unit may derive the time information mentioned above from the deflection command signal.

Generally, real-time acquisition is enabled by the sampling assembly. In some embodiments, the sampling assembly is configured to provide real-time acquisition with very high sample rates.

The sampling assembly may further comprise an analog to digital converter being connected to the input, wherein the analog to digital converter is configured to determine a set of ADC samples based on the input signal. Accordingly, a second set of samples of the same electrical input signal is provided. Both sample sets, i.e. the set of ADC samples and the set of acquisition sample, may be combined in order to enhance the quality of the data.

According to another aspect of the present disclosure, the sampling assembly further comprises an analog to digital converter being connected to the input, wherein the analog to digital converter is configured to determine a set of ADC samples based on the input signal, and wherein the sampling assembly is configured to synchronize the set of acquisition samples and the set of ADC samples. In other words, the sets of samples are aligned with each other, such that a temporal accordance between the two sets is obtained.

The sampling assembly may further comprise an analog to digital converter being connected to the input, wherein the analog to digital converter is configured to determine a set of ADC samples based on the input signal, wherein the sampling assembly is configured to calibrate the light receiver and/or the acquisition unit based on the set of ADC samples. Thus, the sampling assembly comprises one conventional, i.e. electronic analog to digital converter, an optical analog to digital converter module, which comprises the light source, the deflector and the light receiver, as well as the acquisition unit. This optical analog to digital converter may achieve much higher sampling rates compared to the conventional analog to digital converter. In order to enhance the accuracy of the optical analog to digital converter, it is calibrated by using the analog to digital converter.

In some embodiments, the light receiver comprises at least one of a CCD sensor and a CMOS sensor. Both types of sensors have the advantage that they can be used for both low light intensities as well as high light intensities. Thus, even electrical input signals having large variations of the amplitude can be sampled.

In a further embodiment of the present disclosure, the sampling assembly further comprises a signal generator connected to the deflector, the signal generator being configured to generate the deflection command signal. The signal generator may be established as an arbitrary waveform generator. Moreover, the signal generator may be configured to simultaneously generate two or more deflection command signals. For example, the signal generator may generate two sine-waves that are phase-shifted by 90° compared to each other.

Embodiments of the present disclosure further provide a testing instrument that comprises a sampling assembly. The sampling assembly comprises an input, a light source unit, at least one deflector unit, and a light receiver. The input is configured to receive an electrical input signal. The light source unit is configured to generate and output a light beam in the direction of the deflector unit. The light source unit is configured to adapt an intensity of the light beam based on an amplitude of the input signal. The deflector unit is configured to obtain a deflection command signal. The deflector unit further is configured to deflect the light beam into at least one spatial direction based on the deflection command signal. The light receiver comprises at least two photosensitive pixels. The light receiver is configured to receive the light beam via at least one of the at least two photosensitive pixels, and the light receiver is configured to convert received light into an electrical output signal.

In some embodiments, the testing instrument comprises the sampling assembly described above.

Generally, the testing instrument is a digital measurement device that is configured to digitize and analyze analog input signals.

The testing instrument may be established as a (digital) oscilloscope, as a vector network analyzer or as any other kind of measurement device.

Regarding the further properties and the advantages of the testing instrument, reference is made to the explanations given above regarding the sampling assembly, which also hold for the testing instrument and vice versa.

In some embodiments, the sampling assembly further comprises an acquisition circuit or unit connected to the light receiver, the acquisition unit being configured to determine a set of acquisition samples based on the electrical output signal. The individual acquisition samples contain information about the amplitude of the original input signal, as the amplitude of the electrical output signal corresponding to that particular acquisition sample is proportional to the light beam intensity, which in turn is proportional to the amplitude of the electrical input signal.

According to another aspect of the present disclosure, the sampling assembly further comprises an analog to digital converter connected to the input, wherein the analog to digital converter is configured to determine a set of ADC samples based on the input signal. Accordingly, a second set of samples of the same electrical input signal is provided. Both sample sets, i.e. the set of ADC samples and the set of acquisition sample, may be combined in order to enhance the quality of the data.

The sampling assembly may further comprise an analog to digital converter connected to the input, wherein the analog to digital converter is configured to determine a set of ADC samples based on the input signal, and wherein the sampling assembly is configured to synchronize the set of acquisition samples and the set of ADC samples. In other words, the sets of samples are aligned with one another, such that a temporal accordance between the two sets is obtained.

In a further embodiment of the present disclosure, the sampling assembly further comprises an analog to digital converter connected to the input, wherein the analog to digital converter is configured to determine a set of ADC samples based on the input signal, and wherein the sampling assembly is configured to calibrate the light receiver and/or the acquisition unit based on the set of ADC samples. Thus, the testing instrument comprises one conventional, i.e. electronic analog to digital converter, an optical analog to digital converter module, which comprises the light source unit, the deflector unit and the light receiver, as well as the acquisition unit. This optical analog to digital converter module may achieve much higher sampling rates compared to the conventional analog to digital converter. In order to enhance the accuracy of the optical analog to digital converter, it is calibrated by using the analog to digital converter.

In some embodiments, at least one of the testing instrument and the sampling assembly further comprises a signal generator being connected to the deflector unit, the signal generator being configured to generate the deflection command signal. The signal generator may be established as an arbitrary waveform generator. Moreover, the signal generator may be configured to simultaneously generate two or more deflection command signals. For example, the signal generator may generate two sine-waves that are phase-shifted by 90° compared to each other.

Embodiments of the present disclosure further provide a sampling assembly. The sampling assembly comprises an input, a particle source unit, at least one deflector unit, and a particle receiver. The input is configured to receive an electrical input signal. The particle source unit is configured to generate and output a particle beam in the direction of the deflector unit. The particle source unit is configured to adapt an intensity of the particle beam based on an amplitude of the input signal. The deflector unit is configured to obtain a deflection command signal. The deflector unit further is configured to deflect the particle beam into at least one spatial direction based on the deflection command signal. The particle receiver comprises at least two particle-sensitive pixels. The particle receiver is configured to receive the particle beam via at least one of the at least two particle-sensitive pixels. The particle receiver is configured to convert received particles into an electrical output signal.

Thus, compared to the embodiment of the sampling assembly described above, a particle beam is generated instead of a light beam. Of course, light beams can also be described to consist of particles. However, in the context of this disclosure, the term "particles" is understood to only mean particles that are related to matter, for example charged particles, i.e. electrons and protons.

In some embodiments, the particle source unit is established as an electron source unit that is configured to generate an electron beam, wherein the intensity of the electron beam is adapted based on the momentary amplitude of the electrical input signal.

Of course, with the light source unit being replaced by a particle source unit, the deflector unit is adapted as well. For example, the deflector unit is configured to deflect the particle beam via suitable electric and/or magnetic fields.

Regarding the further properties and the advantages of this embodiment of the sampling assembly, reference is made to the explanations given above regarding the first embodiment of the sampling assembly, which also hold for the second embodiment of the sampling assembly and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
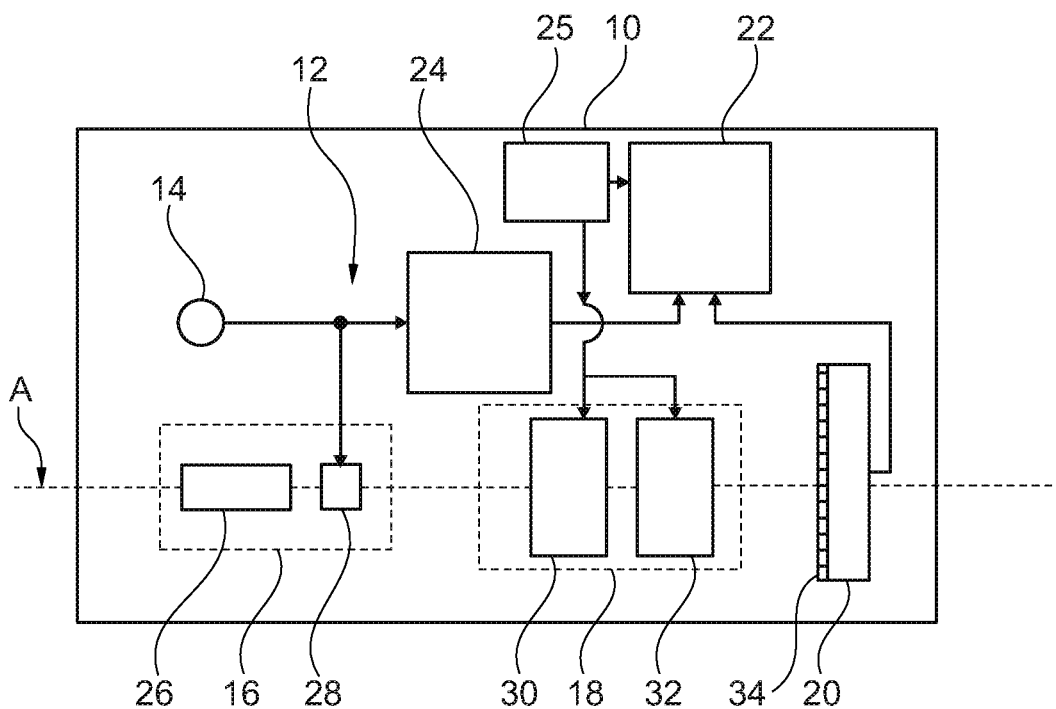
FIG. 1 schematically shows a representative testing instrument according to an embodiment of the present disclosure.

FIG. 1 schematically shows a testing instrument 10. Generally speaking, the testing instrument 10 may be a measurement instrument that is used to measure and analyze electromagnetic signals of any type.

In some embodiments, the testing instrument 10 is a digital measurement device that is configured to digitize and analyze analog input signals, as will be described in more detail below. For example, the testing instrument 10 may be established as a (digital) oscilloscope, as a vector network analyzer or as any other kind of measurement device.

The testing instrument 10 comprises a sampling assembly 12 with an input 14, a light source, such as light source unit 16, a deflector, such as deflector unit 18, a light receiver 20, an acquisition circuit or unit 22, an analog to digital converter (ADC) 24, and a signal generator 25.

It is noted that in the context of this disclosure, the term "light" is to be understood to comprise not only visible light, but also light in the infrared range and/or in the ultraviolet range.

The light source unit 16 and the analog to digital converter 24 are each connected to the input 14 in a signal-transmitting manner. In an embodiment, the light source unit 16, the deflector unit 18 and the light receiver 20 are all arranged along a common optical axis A. The light receiver 20 and the analog to digital converter 24 are both connected to the acquisition unit 22 in a signal-transmitting manner.

The light source unit 16 comprises a laser 26 and a light modulator 28, which both are arranged along the optical axis A. The laser 26 and the light modulator 28 may be established separately from each other. Alternatively, the light source unit 16 may be formed in a unitary manner. In other words, the laser 26 has an integrated light modulator, for example an integrated light modulator with respect to the amplitude.

The deflector unit 18 comprises a first deflector element 30 and a second deflector element 32, wherein the deflector elements 30, 32 are both arranged along the optical axis A.

The light receiver 20 is established as a two-dimensional screen, for example as a CCD sensor and/or as a CMOS sensor, having several pixels 34, for example light-sensitive pixels.

Figure 2:
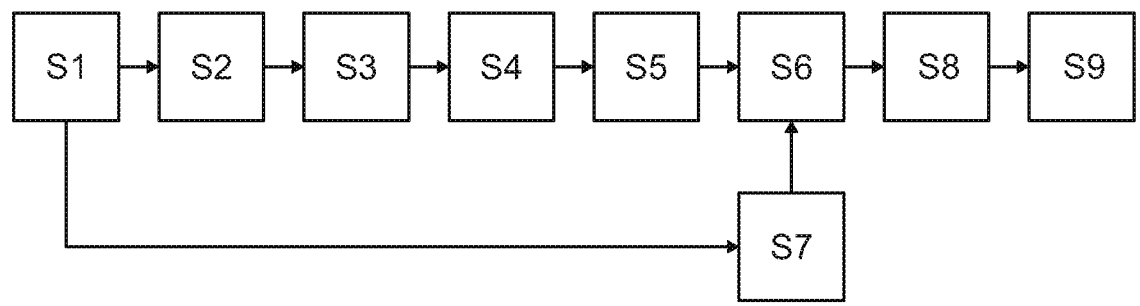
FIG. 2 shows a block diagram of a representative signal analysis method using the testing instrument of FIG. 1.

The testing instrument 10 or rather the sampling assembly 12 is configured to perform a sampling method of sampling an electrical input signal. This sampling method is described in more detail below with reference to FIGS. 1 and 2.

An electrical input signal is received via the input 14 and is forwarded to both the analog to digital converter 24 and to the light source unit 16, more precisely to the light modulator 28 (step S1).

The electrical input signal is an analog signal that is to be digitized by the sampling assembly 12.

Generally speaking, the light source unit 16 generates a light beam based on the electrical input signal and emits the light beam along the optical axis A in the direction of the deflector unit 18 (step S2).

Therein, the light source unit 16 adapts an intensity of the light beam based on a momentary amplitude of the electrical input signal. Thus, a light beam with a higher momentary intensity is generated if the momentary amplitude of the electrical input signal is high, and a light beam with a lower momentary intensity is generated if the momentary amplitude of the electrical input signal is low.

In the specific embodiment depicted in FIG. 1, the laser 26 generates a laser beam that is subsequently dampened by the light modulator 28 based on the momentary amplitude of the electrical input signal. In other words, the laser 26 always generates a light beam having a constant intensity, which however is dampened/attenuated by the light modulator 28 prior to leaving the light source unit 16.

However, it is also possible that the laser 26 itself may generate the laser beam with varying intensity based on a momentary amplitude of the electrical input signal received. In this case, the light modulator 28 is not needed.

In any case, the light source unit 16 has an input for receiving the electrical input signal that is used to adapt the light beam (intensity). This input may be assigned to the laser 26 or the light modulator 28.

In addition, the signal generator 25 generates a deflection command signal and forwards the deflection command signal to the deflection unit 18 (step S3).

Based on the deflection command signal, the deflector unit 18 deflects the light beam into at least one spatial direction, for example into two spatial directions (step S4).

Thus, the deflected light beam encloses an angle with the optical axis A, and with at least one of the spatial direction that are perpendicular to the optical axis A.

More precisely, the deflector unit 18 deflects the light beam according to a predefined pattern, which predefined pattern is determined by the deflection command signal.

Thus, the deflector unit 18 deflects the light beam such that the light beam hits the individual pixels 34 of the light receiver 20 in a predetermined order, wherein the order is determined by the deflection command signal.

Generally speaking, the deflection of the light beam is based on deflection within the first deflector element 30 and/or within the second deflector element 32. The first deflector elements 30 may deflect the light beam in one of the two spatial directions, while the second deflector element 32 may deflect the light beam in the other one of the two spatial directions. In some embodiments, these spatial directions are perpendicular with respect to each other. The first direction may relate to a deflection in horizontal direction, whereas the second direction may relate to a deflection in vertical direction.

The refractive index of the first deflector element 30 and of the second deflector element 32 can individually be controlled by the deflection command signal, such that the deflection angles of the light beam after passing through the deflector elements 30, 32 with respect to the optical axis A are controllable. Put differently, the deflections in the first spatial direction and/or the second spatial direction are controllable.

For example, the first deflector element 30 and/or the second deflector element 32 may each comprise an electro-optic element and/or a acousto-optic element. The refractive index of such components can be controlled by applying an electric field or a sound wave to the component, respectively.

The functionality of the deflector elements 30, 32 may be based on the Pockels effect and/or the Kerr effect.

Thus, the deflection command signal may be an electrical signal that is applied to the deflector elements 30, 32. Alternatively or additionally, the deflection command signal may be converted into an acoustic signal, and the acoustic signal may be applied to the deflector elements 30, 32.

Thus, due to the steps S3 and S4 described above, the light beam is deflected such that it hits pixels 34 in a predefined order, wherein the predefined order is known or can at least be reconstructed from the deflection command signal generated by the signal generator 25.

In some embodiments, the light beam is deflected such that it hits the pixels 34 in a periodic pattern, i.e. in a repeating pattern.

The deflection command signal may be generated such that the pattern or rather the order of pixels hit by the light beam can easily be identified. For example, the light beam may be deflected such that it hits the pixels 34 in a spiral pattern, in a zig-zag-pattern, etc.

Alternatively or additionally, the light beam may be deflected such that it hits at least a predefined portion of the pixels 34 within one repetition of the pattern. The light beam may hit at least 25% of the pixels, at least 50% of the pixels and/or at least 75% of the pixels 34. In some embodiments, the light beam may hit all of the pixels 34 during one repetition of the pattern.

Figure 3:
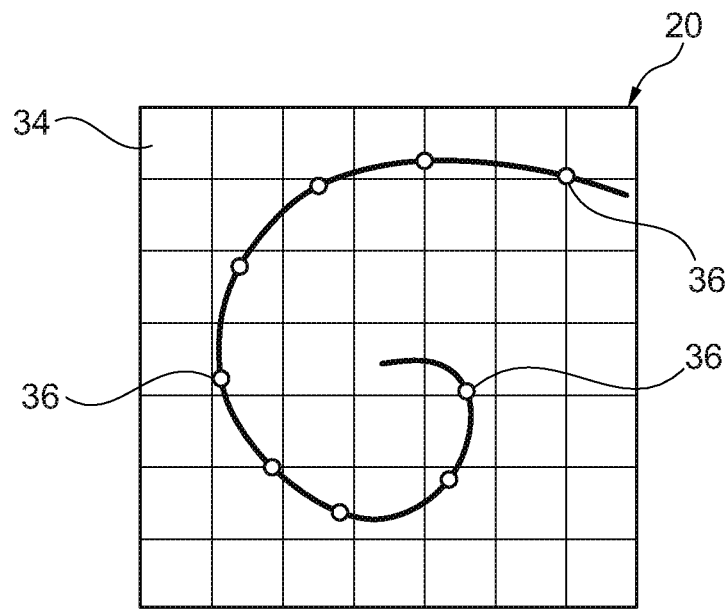
FIG. 3 shows a front view of a light receiver of the testing instrument of FIG. 1.

FIG. 3 illustrates one example for such a pattern, namely the spiral pattern already mentioned above. As is also shown in FIG. 3, the light beam may be generated and/or deflected such that time markers are generated. For example, the laser 26 may be operated in a pulsed operation mode, such that there are gaps within the pattern of the light beam hitting the pixels 34.

The individual pixels 34 each convert the impinging light of the light beam into an electrical output signal (step S5). Therein, the amplitude of the electrical output signals that are output by the individual pixels are proportional to the respective intensity of the light beam falling onto that particular pixel 34.

The electrical output signals generated by the pixels 34 are forwarded to the acquisition unit 22. The acquisition unit 22 determines a set of acquisition samples based on the electrical output signals of the pixels 34 (step S6).

Therein, the individual acquisition samples contain information about the amplitude of the original input signal, as the amplitude of the electrical output signal corresponding to that particular acquisition sample is proportional to the light beam intensity, which in turn is proportional to the amplitude of the electrical input signal.

Moreover, the acquisition samples also contain time information about the time relation between the individual acquisition samples, as the correct order of the individual acquisition samples is the same as the order in which the corresponding pixels 34 are hit by the light beam.

The time information may also be derived from the deflection command signal, which may be forwarded to the acquisition unit 22.

Thus, the set of acquisition samples comprises information about the development of the amplitude of the electrical input signal over time. In other words, the set of acquisition samples corresponds to a sampled version of the original electrical input signal.

In order to calibrate and/or improve the accuracy of the method described above, the following additional steps may be performed.

The electrical input signal is digitized via the analog to digital converter 24 (step S7). Thereby, a set of ADC samples is generated.

For input signal frequencies exceeding the sampling rate of the analog to digital converter 24, the electrical input signal may be "under-sampled", i.e. the number of sampling points per time interval is not enough in order to unambiguously reconstruct the electrical input signal. However, at the individual sampling points, the amplitude and time information contained in the set of ADC samples is correct.

The acquisition unit 22 may synchronize the set of ADC samples and the set of acquisition samples (step S8). In other words, the sets of samples are aligned with one another, such that a temporal accordance between the two sets is obtained.

Figure 4:
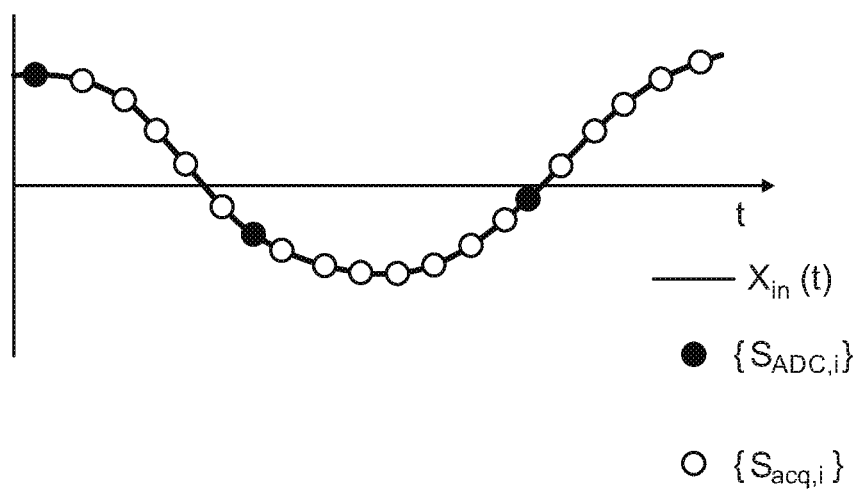
FIG. 4 schematically shows two sets of samples of an input signal.

The result of step S8 is illustrated in FIG. 4, which shows the original electrical input signal $x_{in}(t)$, the set of ADC samples $\{s_{ADC,i}\}$ and the set of acquisition samples $\{s_{acq,i}\}$, each plotted against time t.

Based on the ADC samples, the light receiver 20 and/or the acquisition unit 22 may be calibrated (step S9).

As already mentioned above, the amplitude information contained in the ADC samples is correct, even if the number of samples may be not enough to accurately reconstruct the electrical input signal.

Thus, as soon as the two sets are correctly aligned, the amplitude information of the set of ADC samples is used to calibrate the light receiver 20 and/or the acquisition unit 22 to correctly interpret the signals from the light receiver 20.

Thus, the test instrument 10 described above comprises the "conventional" analog to digital converter 24, an optical analog to digital converter module, which comprises the light source unit 16, the deflector unit 18 and the light receiver 20, as well as the acquisition unit 22.

This optical analog to digital converter module may achieve much higher sampling rates compared to the analog to digital converter 24. In order to enhance the accuracy of the optical analog to digital converter, it is calibrated by using the analog to digital converter 24.

It is noted that it is possible to replace the light source unit 16 with a corresponding particle source unit. Thus, compared to the embodiment of the sampling assembly described above, a particle beam is generated instead of a light beam.

In some embodiments, the particle source unit is established as an electron source unit that is configured to generate an electron beam, wherein the intensity of the electron beam is adapted based on the momentary amplitude of the electrical input signal.

Of course, with the light source unit 16 being replaced by a particle source unit, the deflector unit is adapted as well. For example, the deflector unit 18 may be adapted to deflect the particle beam via suitable electric and/or magnetic fields.

Moreover, the light receiver 20 described above is replaced with a corresponding particle receiver. The particle receiver comprises pixels that are each configured to generate an electrical output signal when hit by the particle beam, analogously to the embodiment described above.

Certain embodiments disclosed herein utilize circuitry (e.g., one or more circuits) in order to implement protocols, methodologies or technologies disclosed herein, operably couple two or more components, generate information, process information, analyze information, generate signals, acquire signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of converting an electrical input signal into a set of acquisition samples, the method comprising:
   receiving an electrical input signal;
   generating and outputting a light beam or a particle beam based on said electrical input signal;
   deflecting said light beam or said particle beam into at least one spatial direction based on a deflection command signal, wherein said light beam or said particle beam is deflected according to a predefined pattern, wherein the predefined pattern is determined by the deflection command signal;
   receiving said light beam or said particle beam by photosensitive pixels and converting said received light beam or said particle beam into electrical output signals; and
   determining a set of acquisition samples based on the electrical output signals, wherein the set of acquisition samples comprises a plurality of acquisition samples, wherein the acquisition samples comprise information about an amplitude of the electrical input signal, and wherein the acquisition samples comprise time information about a time relation between the acquisition samples.

2. The method of claim 1, wherein said deflecting said light beam further comprises providing one of an electric field or a sound wave, said one of an electric field or a sound wave causing the light beam to be deflected into the at least one spatial direction.

3. The method of claim 1, wherein said deflecting said particle beam further comprises providing one of an electric field or a magnetic field, said one of an electric field or a magnetic field causing the particle beam to be deflected into the at least one spatial direction.

4. The method of claim 1, further comprising digitizing the electrical input signal to obtain a set of analog-to-digital converter (ADC) samples, and synchronizing the set of ADC samples with the set of acquisition samples.

5. The method of claim 4, wherein the set of ADC samples is aligned with the set of acquisition samples such that a temporal accordance is obtained between the set of ADC samples and the set of acquisition samples.

6. The method of claim 1, further comprising adapting an intensity of said light beam or an intensity of said particle beam based on a momentary amplitude of the electrical input signal.

7. The method of claim 1, wherein said light beam or said particle beam is deflected such that the photosensitive pixels are hit by said light beam or said particle beam in a predetermined order, wherein the predetermined order is determined by the deflection command signal.

8. The method of claim 7, wherein said light beam or said particle beam is deflected such that the photosensitive pixels are hit by said light beam or said particle beam in a periodic pattern.

9. The method of claim 8, wherein the periodic pattern comprises a spiral pattern or a zig-zag pattern.

10. The method of claim 8, wherein the said light beam or said particle beam is deflected such that at least 25 percent of the photosensitive pixels are hit by said light beam or said particle beam within one repetition of said periodic pattern.

11. The method of claim 8, wherein the said light beam or said particle beam is deflected such that at least 50 percent of the photosensitive pixels are hit by said light beam or said particle beam within one repetition of said periodic pattern.

12. The method of claim 1, wherein said time information about the time relation between the acquisition samples is derived from the deflection command signal.

13. The method of claim 1, wherein the acquisition samples comprise information about a development of the amplitude of the electrical input signal over time.

* * * * *